(12) United States Patent
McLaurin (10) Patent No.: US 9,612,280 B2
(45) Date of Patent: Apr. 4, 2017

(54) PARTIAL SCAN CELL

(71) Applicant: ARM Limited, Cambridge (GB)

(72) Inventor: Teresa Louise McLaurin, Austin, TX (US)

(73) Assignee: ARM Limited, Cambridge (GB)

( * ) Notice: Subject to any disclaimer, the term of this patent is extended or adjusted under 35 U.S.C. 154(b) by 102 days.

(21) Appl. No.: 14/492,784

(22) Filed: Sep. 22, 2014

(65) Prior Publication Data

US 2015/0143190 A1    May 21, 2015

(30) Foreign Application Priority Data

Nov. 21, 2013   (GB) .................................. 1320559.6

(51) Int. Cl.
*G01R 31/28* (2006.01)
*G01R 31/3177* (2006.01)
*G01R 31/3185* (2006.01)

(52) U.S. Cl.
CPC . *G01R 31/3177* (2013.01); *G01R 31/318541* (2013.01)

(58) Field of Classification Search
CPC .................... G01R 31/3177; G01R 31/318541
See application file for complete search history.

(56) References Cited

U.S. PATENT DOCUMENTS

| | | | |
|---|---|---|---|
| 5,329,533 A | 7/1994 | Lin | |
| 2002/0113624 A1* | 8/2002 | Hill | H03K 19/01728 326/104 |
| 2005/0039093 A1 | 2/2005 | Bailliet et al. | |
| 2007/0234159 A1 | 10/2007 | Bushard et al. | |
| 2012/0124437 A1* | 5/2012 | Xie | G01R 31/31853 714/726 |
| 2013/0103994 A1* | 4/2013 | Tekumalla | G01R 31/31859 714/726 |
| 2013/0179742 A1* | 7/2013 | Tekumalla | G01R 31/31854 714/726 |
| 2013/0185608 A1* | 7/2013 | Bhawmik | G01R 31/31850 714/727 |
| 2015/0039956 A1* | 2/2015 | Goh | G01R 31/31854 714/729 |

OTHER PUBLICATIONS

UK Search Report for GB Application No. 1320559.6, mailed May 6, 2014, 3 pages.

* cited by examiner

*Primary Examiner* — April Y Blair
*Assistant Examiner* — Thien D Nguyen
(74) *Attorney, Agent, or Firm* — Pramudji Law Group PLLC; Ari Pramudji (57) ABSTRACT

An integrated circuit 2 is provided with a serial scan chain. Disposed between at least some serial scan cells 32, 34 forming a serial scan chain there is provided a partial scan cells 36. These partial scan cells are arranged such that during a scan mode in which serial data is being shifted into and out of the serial scan cells, a fixed value is captured and stored into the partial scan cell 36. This avoids the presence of unknown data values within the signal paths between the functional logic 38, 40 which is to be tested.

15 Claims, 5 Drawing Sheets

PARTIAL SCAN CELL

CROSS-REFERENCE TO RELATED APPLICATIONS

This application claims priority to GB Application No. 1320559.6, filed on Nov. 21, 2013; the entire content of which is hereby incorporated by reference.

BACKGROUND OF THE INVENTION

Field

This disclosure relates to the field of integrated circuits. More particularly, this disclosure relates to partial scan cells for use within serial scan chains for performing diagnostic operations upon integrated circuits.

Description

It is known to provide integrated circuits with serial scan chains for applying stimulus signals to an integrated circuit and for capturing response signals from the integrated circuit.

SUMMARY

Viewed from one aspect the present invention provides an integrated circuit comprising:

a serial scan chain comprising a plurality of serial scan cells, each of said plurality serial scan cells configured to operate under control of a clock signal:
 (i) in a functional mode to capture and to store a functional signal value; and
 (ii) in a scan mode to serially shift scan signal values through said serial scan chain; and
a partial scan cell connected in a signal path between a signal output of one serial scan cell of said serial scan chain and a signal input of another serial scan cell of said serial scan chain, said partial scan cell configured to operate under control of said clock signal:
(i) in said functional mode to capture and to store a signal value dependent upon a signal output from said one serial scan cell; and
(ii) in said scan mode to capture and to store a fixed signal value.

Viewed from another aspect the present invention provides an integrated circuit comprising:

serial scan chain means for performing diagnostic operations, said serial scan chain means comprising a plurality of serial scan cell means for capturing and storing signal values, each of said plurality serial scan cell means configured to operate under control of a clock signal:
 (i) in a functional mode to capture and to store a functional signal value; and
 (ii) in a scan mode to serially shift scan signal values through said serial scan chain; and
partial scan cell means for capturing and storing a signal value, said partial scan cell means connected in a signal path between a signal output of one serial scan cell means of said serial scan chain means and a signal input of another serial scan cell means of said serial scan chain means, said partial scan cell means configured to operate under control of said clock signal:
 (i) in said functional mode to capture and to store a signal value dependent upon a signal output from said one serial scan cell means; and
 (ii) in said scan mode to capture and to store a fixed signal value.

Viewed from a further aspect the present invention provides a partial scan chain cell circuit configured to switch between a scan mode and a functional mode under control of a scan enable signal, said partial scan chain cell comprising:
a partial-scan-cell signal value storage circuit having a partial-scan-cell storage input; and
a logic circuit coupled to said partial-scan-cell storage input, said logic circuit configured to generate:
 (i) a functional signal value when said scan enable signal has a scan enable value corresponding to said functional mode; and
 (ii) a fixed signal value when said scan enable signal has a scan enable value corresponding to said scan mode.

Viewed from a further aspect the present invention provides a partial scan chain cell circuit configured to switch between a scan mode and a functional mode under control of a scan enable signal, said partial scan chain cell comprising:
partial-scan-cell signal value storage means for storing a signal value, said partial-scan-cell signal value storage means having a partial-scan-cell storage input; and
logic means for performing a logic processing operation, said logic means coupled to said partial-scan-cell storage input and said logic means configured to generate:
 (i) a functional signal value when said scan enable signal has a scan enable value corresponding to said functional mode; and
 (ii) a fixed signal value when said scan enable signal has a scan enable value corresponding to said scan mode.

Another aspect of the present invention is the provision of a cell library stored on a non-transitory storage medium providing layout data for driving an automated manufacturing process to produce an integrated circuit including a partial scan cell of the type discussed above.

Viewed from a further aspect the present invention provides a method comprising the steps of:
serially scanning in stimulus signal values into a plurality of serial scan cells arranged in a serial scan chain under control of said clock signal;
switching to a functional mode;
applying a plurality of cycles of the clock signal to propagate a signal at least from a first of said plurality of serial scan cells through a partial scan cell to a second of said plurality of serial scan cells and to propagate said fixed signal value along said serial scan chain;
switching to said scan mode; and
serially scanning out captured signal values from said plurality of serial scan cells under control of said clock signal.

The above, and other objects, features and advantages of this disclosure will be apparent from the following detailed description of illustrative embodiments which is to be read in connection with the accompanying drawings.

DRAWINGS

Embodiments of the disclosure will now be described, by way of example only, with reference to the accompanying drawings which.

EMBODIMENTS

As integrated circuits become more complex, the number of serial scan cells which need to be provided in order to give adequate coverage for the application of stimulus signals and the capture of response signals also increases. One problem with this trend is that when serial data is being serially shifted through the scan chain cells, then a large number of scan chain cells shifts state on each clock cycle and this can consume a relatively large current producing a reduction in operating voltage that can compromise the proper operation (state retention) of the integrated circuit. Furthermore, in order to address timing issues associated with signal hold values at inputs to serial scan cells, it is often necessary to employ buffer circuits between serial scan cells. These buffer circuits represent a disadvantageous circuit area and power overhead.

One way of addressing at least some of these problems is to use partial scan cells which are located between serial scan cells and propagate a signal value (which may change along its path due to the effect of other signals) between serial scan cells. Such partial scan cells are not directly accessible during the serial scan shifting operations, but using a combination of serial shifting operations with the serial scan cells and a controlled number of clock cycles applied to the functional circuitry and single/partial scan cells, it is possible to load a partial scan cell with a desired value or capture a value from a partial scan cell.

Since the partial scan cells are not clocked during the scan operations when serially scanning in or serially scanning out diagnostic data, there is a reduction in the number of cells which change state and accordingly a reduction in the current consumed. Furthermore, since there are fewer serial scan cells needed, there is a reduction in the overhead associated with the buffer circuits between those serial scan cells.

A problem with partial scan cells is that since they are not loaded with stimulus values during the serial shift operations, they initially contain unknown signal values when the diagnostic operations start. The presence of such unknown signal values makes it more difficult to employ techniques such as logical built in self test (LBIST) and test pattern compression.

The present technique recognises that the problems associated with partial scan cells containing unknown signal values may be avoided by configuring the partial scan cells such that they capture and store a fixed signal value when in the scan mode. The use of a fixed value (whether this be a zero or a one) provides a known starting state to the signal value stored with the partial scan cells when the stimulus values have been serially clocked in. This facilitates the use of LBIST and pattern compression as unknown signal values no longer have to be accounted for (e.g. masked). If the particular test requires a signal value at one of the partial scan cells which is different from the fixed signal value which the partial scan cell is configured to capture and store in the scan mode, then it is possible to load that partial scan cell with a different value by applying an appropriate value at one or more serial scan cells which feed that partial scan cell and then applying an appropriate number of clock signals to move the partial scan cell into the desired state. It will be appreciated that the fixed signal value could be either a zero or a one, but that by selecting this fixed signal value to be one most suitable for sensitising the integrated circuits to the test desired, then the need to change the signal value stored by that partial scan cell to a different value prior to testing may be reduced.

The plurality of serial scan cells and the partial scan cell may be switched between the functional mode and the scan mode by a shared scan enable signal. This reduces the number of signals required and accordingly the overhead associated therewith (e.g. control and wiring).

The partial scan cell can comprise a partial-scan-cell signal value storage circuit (e.g. D-type flip-flop) having a partial-scan-cell storage input and a logic circuit coupled to that partial-scan-cell storage input. This logic circuit may be configured to generate the fixed value when in the scan mode and to generate a value dependent upon a signal output from an upstream serial scan cell when in the functional mode.

It will be appreciated that the logic circuit used to generate either the fixed signal value or the signal value required during functional mode operation may take a variety of different forms. One form which has a low circuit overhead (e.g. area and power) which may be used in this role is an NOR gate with one input receiving the scan enable signal and the other input receiving a functional mode signal. Another possible form of logic circuit is an NAND gate with one input receiving the scan enable signal and the other input receiving the functional mode signal.

In some embodiments the serial scan cells may be provided in the form of DMux flip-flops in which a multiplexer is coupled to the storage input of the cell and switches between a functional signal value and a serially shifted scan value in dependence upon the scan enable value.

Figure 1:
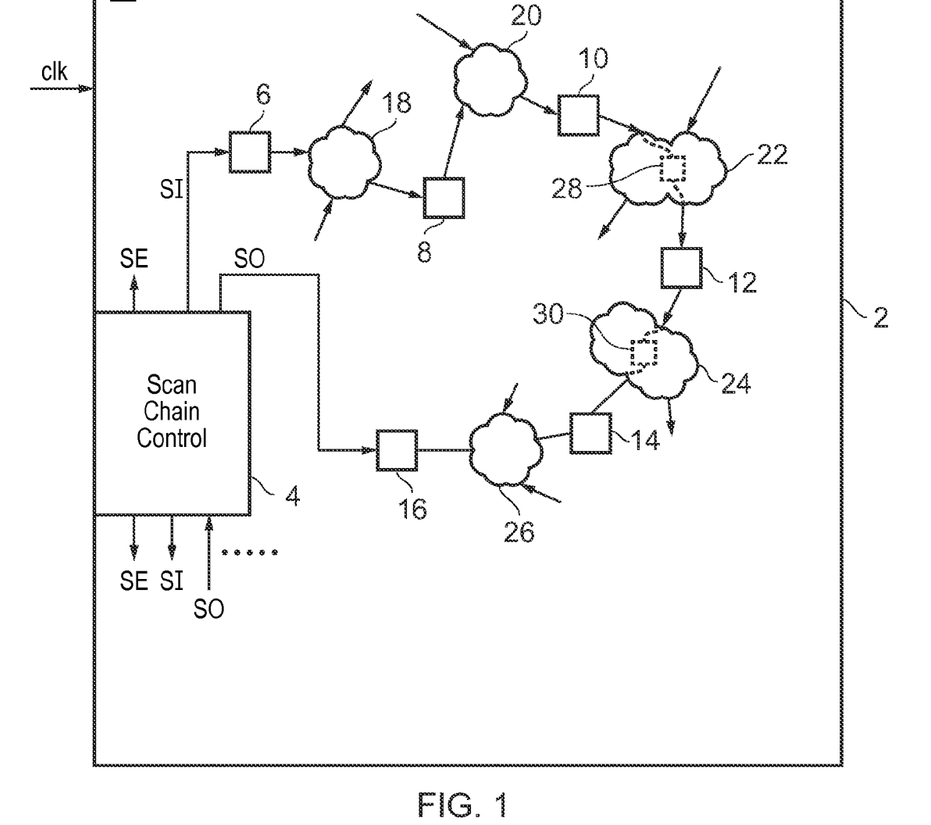
FIG. 1 schematically illustrates an integrated circuit incorporating serial scan chains.

FIG. 1 schematically illustrates an integrated circuit 2 incorporating a plurality of serial scan chain cells operating under control of a scan chain controller 4 during a diagnostic operation. The scan chain controller 4 operates when a scan enable SE signal is asserted to serially shift signal values along a scan chain incorporating serial scan cells 6, 8, 10, 12, 14, 16. Functional logic 18, 20, 22, 24, 26 is disposed between these serial scan cells 6-16 and receives stimulus signals from those serial scan cells 6-16 as well as generating output signals which are captured by those serial scan cells 6-16 Disposed within some of the functional logic 22, 24 are partial scan cells 28, 30 which store and capture signal values under control of the same clock signal clk as the serial scan cells 6-16, but are not themselves in the serial scan path when data is being shifted into or shifted out of the serial scan chain.

Figure 2:
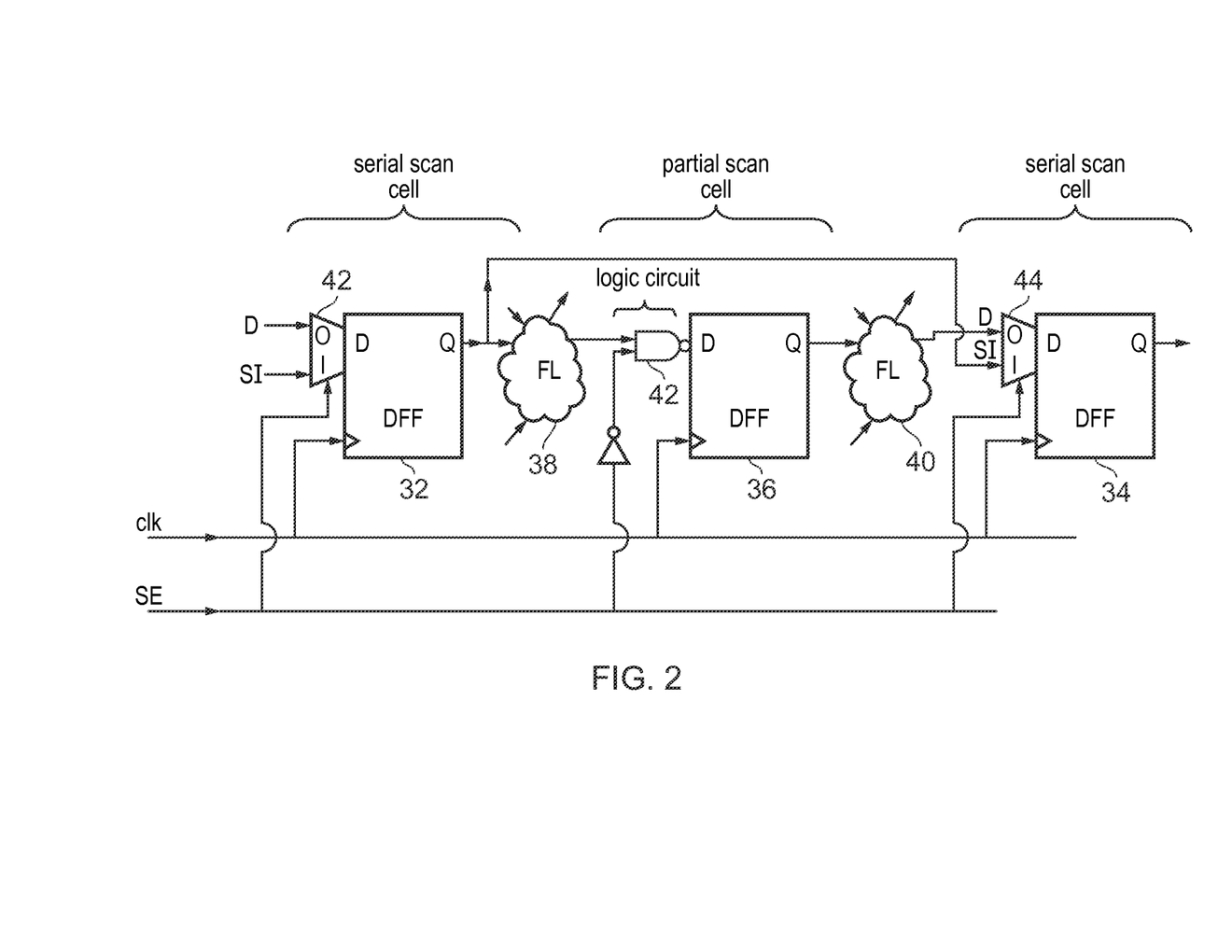
FIG. 2 schematically illustrates a portion of a serial scan chain.

FIG. 2 is a diagram illustrating a portion of a serial scan chain including serial scan cells 32 and 34 between which stimulus values may be shifted in and captured values may be shifted out when operate in the scan mode under control of the clock signal clk. Disposed between these serial scan cells 32 and 34 is a partial scan cell 36. This partial scan cell 36 is also driven to capture and store a signal value at its input D under control of the clock signal clk. The captured signal value is then output from the partial cell output Q during the following clock cycle.

Functional logic 38, 40 is disposed between one serial scan cell 32 and the partial scan cell 36 and between the partial scan cell 36 and another serial scan cell 34. It will be appreciated that there may be additional fan in or fan out of signals associated with the functional logic 38, 40 in the normal manner, but that the output of the functional logic which is captured and stored by the partial scan cell 6 will be dependent upon the output from the serial scan cell 32 during functional mode operation.

When switched to scan mode operation by the scan enable signal SE, logic circuit in the form of an NAND gate 42 at the input of the D-type flip-flop which forms partial scan cell 36 is forced low thereby forcing the input to the D-type flip-flop high irrespective of the signal value received from the functional logic 38. Thus, a fixed value is forced to be captured and stored by the partial scan cell 36 during the scan mode irrespective of the starting state of the functional logic 38. Thus, when in scan mode and stimulus values are being serially shifted into the serial scan cells 32 and 34, a fixed (known) value is captured and stored into the partial scan cell 36 thereby avoiding the occurrence of the unknown value within this partial scan cell 36 at the start of the diagnostic operations.

The serial scan cells in this embodiment have the form of DMux flip-flops having a multiplexer 42, 44 at there input and switched by the scan enable signal to select between the functional signal D and the serial input signal SI.

Figure 3:
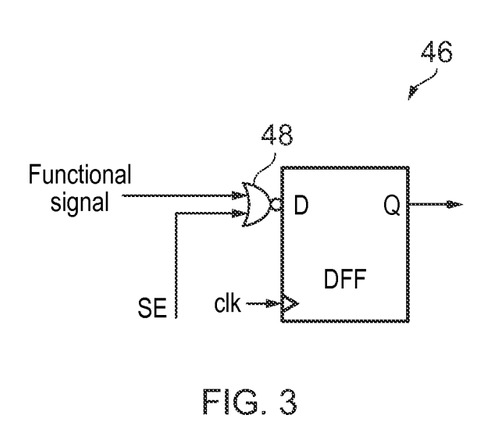
FIG. 3 schematically illustrates a partial scan cell.

FIG. 3 schematically illustrates a partial scan cell 46 with a different form. In this example, the logic circuitry at the input to the partial scan cell 46 is in the form of NOR gate 48 with one input receiving the functional signal from upstream functional logic and the other input receiving the scan enable signal (active high) so as to force the input to the partial scan cell low when in the scan mode irrespective of the functional signal received at the other input of the NOR gate 48. Conversely, in the functional mode when the scan enable signal SE is low, the input to the partial scan cell 46 will change value in dependence upon the signal received from the upstream functional logic.

Figure 4:
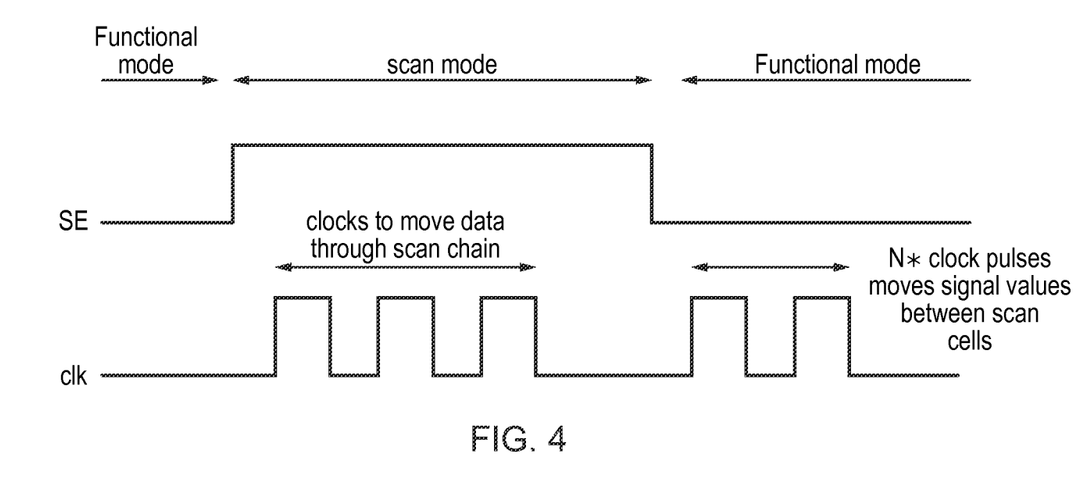
FIG. 4 is a signal timing diagram showing a scan enable signal and a clock signal.

FIG. 4 is a signal timing diagram illustrating the scan enable signal and the clock signal as utilise by the circuits of FIGS. 1 to 3. The scan enable signal SE is active high and switches the circuitry between the functional mode when scan enable SE is low and the scan mode when scan enable SE is high. When in the functional mode, the application of a number of clock pulses (e.g. N clock pulses) serves to move signal values between scan cells (whether those be serial scan cells or partial scan cells). Accordingly, if one serial scan cell is directly connect to another serial scan cell via functional logic, then only one clock pulse will be needed to propagate stimulus value through that functional logic to the next serial scan cell for capture of a result signal. However, if a partial scan cell is located between one serial scan cell and another serial scan cell between which it is desired to propagate a signal, and then two clock pulses will be needed. The first clock pulse will move a signal value from the one serial scan cell to the partial scan cell. The second clock pulse will move a signal value from the partial scan cell to the another serial scan cell. It will be appreciated that while the use of partial scan cells may reduce the stimulus vector and capture vector length (length of serial scan patterns to be scanned in and scanned out), it will be accompanied by a number of clock cycles which need to be provided when partial scan cells are used between serial scan cells. However, the extra clock pulses needed to move data through the partial scan cells and be shared across many partial scan cells and thereby amortise their overhead. For example, if a partial scan cell were provided between every serial scan cell within a scan chain, then the vector length would be halved. This might reduce the number of clock cycles needed to scan data in and scan data out by, for example, 100 cycles to 50 cycles. The one additional clock cycle which need be provided during functional mode to move the signals through the partial scan cells is a relatively small additional overhead compared with the saving of clock cycles required to shift data in and out of the scan chain.

Figure 5:
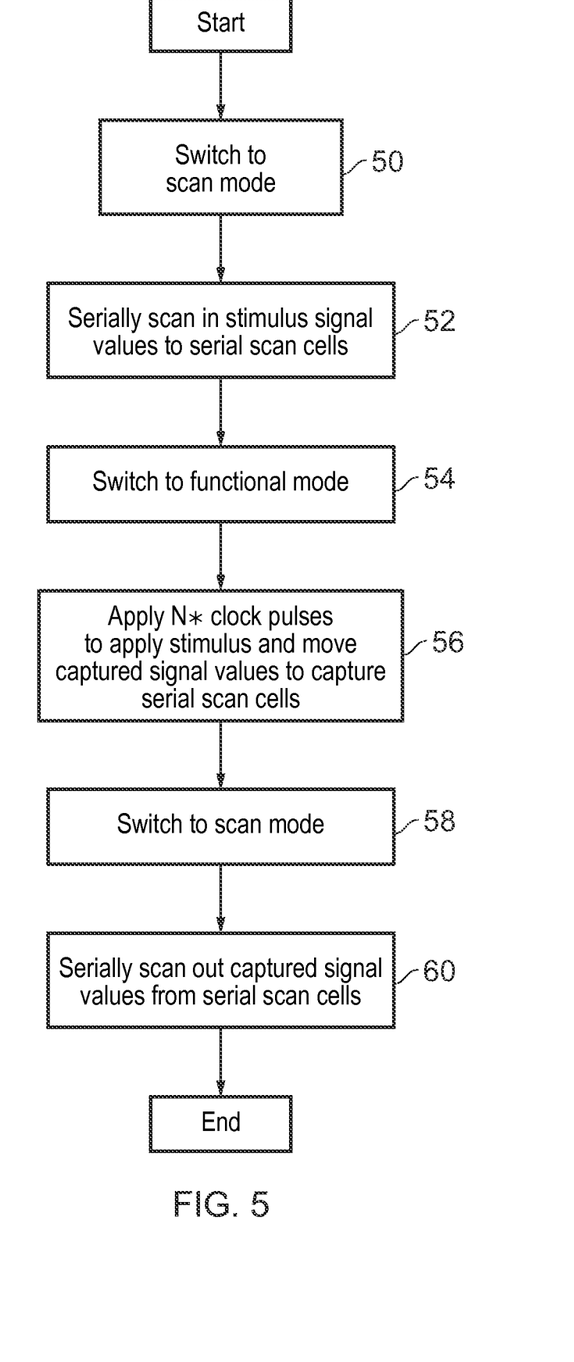
FIG. 5 is a flow diagram schematically illustrating a diagnostic operation performed using a scan chain including both serial scan cells and partial scan cells.

FIG. 5 is a flow diagram schematically illustrating diagnostic operation. At step 50 a switch is made to scan mode (if the system is not already in this state). At step 52 stimulus signal values are serially scanned into the serial scan cells. At step 54 a switch is made to functional mode. At step 56 a plurality of clock pulses are applied so as to supply the desired stimulus signal values to the functional logic and move captured signal values to the serial scan cells from to which they will be captured (and subsequently serially shifted out). At step 58 the system is switched back to scan mode. At step 60 the captured signal values are serially shifted out of the serial scan cells.

It will be appreciated that the partial scan cells as illustrated, for example, in FIGS. 2 and 3 will typically be provided as part of a cell library for use in the design and manufacture of integrated circuits. Such cell libraries typically contain many standard circuit cells from which an integrated circuit design is assembled. The cell library is in the form of a computer readable medium storing data defining the standard cells stored, e.g. a non-transitory computer readable medium. Such a cell library may be provided as one input to an automated design and manufacture process such that when combined with the logical design of the integrated circuit desired (e.g. An RTL design or a derivative thereof), then software tools may be used to generate the appropriate circuit layouts for a generation of appropriate masks for circuit manufacture.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

I claim:

1. An integrated circuit comprising:
    a serial scan chain having a plurality of serial scan cells, each of said plurality serial scan cells having a first input logic circuit and operating under control of a clock signal, and each first input logic circuit comprises a multiplexer operating based on a scan enable signal:
        (i) in a functional mode to capture and to store a functional signal value; and
        (ii) in a scan mode to serially shift scan signal values through said serial scan chain,
        wherein each of said plurality of serial scan cells is a D flip-flop having the multiplexer coupled to a D input thereof, wherein the multiplexer is switched by the scan enable signal to select between a functional input signal and a serial input signal, and wherein the serial input signal is received as a Q signal output from a previous serial scan cell in said serial scan chain; and
    a partial scan cell coupled in a signal path between the Q signal output of the previous serial scan cell of said serial scan chain and a D signal input of the multiplexer coupled to the D input of a next serial scan cell of said serial scan chain, said partial scan cell having a second input logic circuit that is different than first input logic circuit, said partial scan cell operating under control of said clock signal, said second input logic circuit operating based on the scan enable signal:

(i) in said functional mode to capture and to store a signal value dependent upon a signal output from said one serial scan cell; and (ii) in said scan mode to capture and to store a fixed signal value.

2. An integrated circuit as claimed in claim 1, wherein said plurality of serial scan cells and said partial scan cell are switched between said functional mode and said scan mode by the scan enable signal.

3. An integrated circuit as claimed in claim 2, wherein said partial scan cell comprises a partial-scan-cell signal value storage circuit having a partial-scan-cell storage input and the second input logic circuit coupled to said partial-scan-cell storage input, said logic circuit configured to generate:

(i) a value dependent upon said signal output from said one serial scan cell when said scan enable signal has a scan enable value corresponding to said functional mode; and (ii) said fixed signal value when said scan enable signal has a scan enable value corresponding to said scan mode.

4. An integrated circuit as claimed in claim 3, wherein said second input logic circuit comprises one of:

(i) an NOR gate with a first NOR input receiving said scan enable signal and a second NOR input receiving a signal dependent upon said signal output from said one scan cell; and (ii) an NAND gate with a first NAND input receiving said scan enable signal and a second NAND input receiving said signal dependent upon said signal output from said one scan cell.

5. An integrated circuit as claimed in claim 2, wherein each of said serial scan cells comprises a serial-scan-cell signal value storage circuit having a serial-scan-cell storage input and the first input logic circuit comprises a multiplexer coupled to said serial-scan-cell storage input, said multiplexer configured to select for input to said serial-scan-cell storage input:

(i) said functional signal value when said scan enable signal has a scan enable value corresponding to said functional mode; and (ii) a serially shifted scan signal value when said scan enable signal has a scan enable value corresponding to said scan mode.

6. The integrated circuit of claim 1, wherein the partial scan cell is a D flip-flop having an output of the second input logic circuit coupled to a D input thereof, wherein the second input logic circuit receives the functional input signal and the serial enable signal, and wherein the functional input signal is received as the Q signal output from the previous serial scan cell in said serial scan chain.

7. A circuit configured to switch between a scan mode and a functional mode under control of a scan enable signal, said circuit comprising:

a serial-scan-cell signal value storage circuit having a serial-scan-cell storage input and a first input logic circuit coupled to said serial-scan-cell storage input, said first input logic circuit is a multiplexer configured to select for input to said serial-scan-cell storage input:

(i) said functional signal value when said scan enable signal has a scan enable value corresponding to said functional mode; and (ii) a serially shifted scan signal value when said scan enable signal has a scan enable value corresponding to said scan mode, wherein the serial-scan-cell signal value storage circuit is a D flip-flop and the multiplexer is coupled to a D input thereof, and wherein the multiplexer is switched by said scan enable signal to select between said functional signal value and said serially shifted scan signal value; and a partial-scan-cell signal value storage circuit having a partial-scan-cell storage input; and a second input logic circuit coupled to said partial-scan-cell storage input, said second input logic circuit being different than the first input logic circuit, and said second input logic circuit configured to generate:

(i) a functional signal value when said scan enable signal has a scan enable value corresponding to said functional mode; and (ii) a fixed signal value when said scan enable signal has a scan enable value corresponding to said scan mode.

8. A circuit as claimed in claim 7, wherein said second input logic circuit comprises one of:

(i) an NOR gate with a first NOR input receiving said scan enable signal and a second NOR input receiving a signal dependent upon a signal output from said serial-scan-cell signal value storage circuit; and (ii) an NAND gate with a first NAND input receiving said scan enable signal and a second NAND input receiving said signal dependent upon a signal output from said serial-scan-cell signal value storage circuit.

9. A non-transitory storage medium storing a cell library containing one or more layouts for a circuit as claimed in claim 7.

10. The circuit of claim 7, wherein the partial-scan-cell signal value storage circuit is a D flip-flop having an output of the second input logic circuit coupled to a D input thereof, wherein the second input logic circuit receives said functional signal value and said serial enable signal, and wherein said functional signal value is received as said Q output signal from said serial-scan-cell signal value storage circuit.

11. A method comprising serially scanning in stimulus signal values into a plurality of serial scan cells arranged in a serial scan chain under control of a clock signal, each serial scan cell having a multiplexer operating based on a scan enable signal;

switching to a functional mode;

applying a plurality of cycles of the clock signal to propagate a signal at least from a first of said plurality of serial scan cells through a partial scan cell to a second of said plurality of serial scan cells and to propagate a fixed signal value along said serial scan chain, the partial scan cell having a logic circuit operating based on the scan enable signal, the logic circuit being different than the multiplexer;

switching to said scan mode; and serially scanning out captured signal values from said plurality of serial scan cells under control of said clock signal, wherein each serial scan cell is a D flip-flop having the multiplexer coupled to a D input thereof, wherein the multiplexer is switched by the scan enable signal to select between at least one stimulus signal value and a serial input signal that is received as a Q signal output from a previous serial scan cell in said serial scan chain.

12. A method as claimed in claim 11, comprising switching said plurality of serial scan cells and said partial scan cell between said functional mode and said scan mode using the scan enable signal.

13. A method as claimed in claim 12, wherein said partial scan cell comprises a partial-scan-cell signal value storage circuit having a partial-scan-cell storage input and the logic circuit coupled to said partial-scan-cell storage input, said method using said logic circuit to generate:
   (i) a value dependent upon said signal output from said one serial scan cell when said scan enable signal has a scan enable value corresponding to said functional mode; and
   (ii) said fixed signal value when said scan enable signal has a scan enable value corresponding to said scan mode.

14. A method as claimed in claim 13, wherein said logic circuit comprises one of:
   (i) a NOR gate with a first NOR input receiving said scan enable signal and a second NOR input receiving a signal dependent upon said signal output from said one scan cell; and
   (ii) a NAND gate with a first NAND input receiving said scan enable signal and a second NAND input receiving said signal dependent upon said signal output from said one scan cell.

15. The method of claim 11, wherein the partial scan cell is a D flip-flop having an output of the logic circuit coupled to a D input thereof, wherein the logic circuit receives the at least one stimulus signal value and said serial enable signal, and wherein the at least one stimulus signal value is received as the Q signal output from a previous serial scan cell in said serial scan chain.

* * * * *